United States Patent
Li et al.

(10) Patent No.: US 8,532,969 B2
(45) Date of Patent: Sep. 10, 2013

(54) NUMERICAL SIMULATION METHOD FOR CHARACTERIZING FLUID CHANNELLING ALONG LARGE-APERTURE FRACTURES OF RESERVOIRS

(75) Inventors: Yang Li, Beijing (CN); Yongyi Zhou, Dongying (CN); Duanping Wang, Dongying (CN); Xiantai Liu, Dongying (CN); Shuling Sui, Dongying (CN); Shiming Zhang, Dongying (CN); Yong Wang, Dongying (CN); Haibo Su, Dongying (CN); Yajuan Dong, Dongying (CN); Yanhu Chen, Dongying (CN); Yong Song, Dongying (CN)

(73) Assignee: Geo-science Research Institute of Shengli Oil Field Co. Ltd. of Sinopec, Dongying, Shandong Province (CN)

( * ) Notice: Subject to any disclaimer, the term of this patent is extended or adjusted under 35 U.S.C. 154(b) by 319 days.

(21) Appl. No.: 13/040,270

(22) Filed: Mar. 4, 2011

(65) Prior Publication Data

US 2012/0173220 A1  Jul. 5, 2012

(30) Foreign Application Priority Data

Dec. 30, 2010  (CN) .......................... 2010 1 0612901

(51) Int. Cl.
G06G 7/48  (2006.01)
(52) U.S. Cl.
USPC .......................................................... 703/10
(58) Field of Classification Search
USPC .......................................................... 703/10
See application file for complete search history.

(56) References Cited

U.S. PATENT DOCUMENTS

| | | | | |
|---|---|---|---|---|
| 5,988,862 A | * | 11/1999 | Kacyra et al. | 703/6 |
| 6,096,085 A | * | 8/2000 | Sammelman | 703/2 |
| 7,925,482 B2 | * | 4/2011 | Kennon et al. | 703/10 |
| 2007/0016389 A1 | * | 1/2007 | Ozgen | 703/10 |
| 2008/0091396 A1 | * | 4/2008 | Kennon et al. | 703/10 |
| 2011/0120702 A1 | * | 5/2011 | Craig | 166/250.1 |
| 2011/0125471 A1 | * | 5/2011 | Craig et al. | 703/6 |
| 2011/0125476 A1 | * | 5/2011 | Craig | 703/10 |
| 2011/0257944 A1 | * | 10/2011 | Du et al. | 703/2 |

* cited by examiner

Primary Examiner — David Silver

(57) ABSTRACT

A numerical simulation method for characterizing fluid channeling along large-aperture fractures of reservoirs relates to the field of petroleum reservoir development research and computational fluid dynamics. The conventional method can not effectively represent the rapid fluid channeling along large-aperture fractures. Aiming at solving the above technical problem, an advanced method is provided in the present invention. In the invented method, the geometric similarity and hydraulic similarity treatments of large-aperture fractures can be made simultaneously, moreover, the traditional numerical simulation software was improved to be an unstructured grid simulator. Therefore, the method of the present invention can effectively simulate the rapid fluid channeling along large-aperture fractures, consequently it can ensure the reliability of the simulation results and provide reasonable reference for the adjustment and optimization of oil field development plans. The present invention is simple in principle and easy to use, thus it has a great value of application and popularization.

20 Claims, 4 Drawing Sheets

NUMERICAL SIMULATION METHOD FOR CHARACTERIZING FLUID CHANNELLING ALONG LARGE-APERTURE FRACTURES OF RESERVOIRS

BACKGROUND OF THE PRESENT INVENTION

1. Field of Invention

The present invention relates to the fields of petroleum reservoir development research and computational fluid dynamics, and provides a numerical simulation method for characterizing fluid channeling along large-aperture fractures of reservoirs. In the present invention, the "geometric similarity" of large-aperture fractures is achieved by grid division of reservoir to characterize the actual distribution of large-aperture fractures; and the "hydraulic similarity" of large-aperture fractures is achieved by adjusting the permeabilities of the grid faces crossed by large-aperture fractures, and the transmissibilities of the adjusted grid faces must be equal to the actual transmissibilities of large-aperture fractures; furthermore, the traditional numerical simulation software is improved to be an unstructured grid simulator. As a result, the rapid fluid channeling along large-aperture fractures of reservoirs can be reflected very well with the invented numerical simulation method.

2. Description of Related Arts

During oil field development process, it has been found that water breakthrough occurs late in the production wells which are close to the water injection wells, while occurs soon in the production wells far away from the water injection wells. Such phenomenon is often caused by water channeling along large-aperture fractures. How to represent the rapid fluid channeling in large-aperture fractures has been an important technical problem and also a hot research topic in the field of numerical reservoir simulation.

In recent years, several commercial numerical simulation softwares have developed an equivalent simulation method for characterizing rapid fluid channeling along large-aperture fractures; however, our tests found that this processing method is not so valid. The success and effectiveness of the examples for the softwares is due to the use of "non-neighbor connection" (NNC) technique. In the NNC method, the grids which have free water are directly connected to the perforated grids of the production wells, consequently two grids spatially far away from each other are made artificially to be "directly adjacent". Obviously, this method can not satisfy the criteria of the geometric similarity and hydraulic similarity in reservoir simulation.

In last several years, the discrete fracture network simulation technique has been in the ascendant and become popular in the numerical simulation of fractured reservoirs. Literature shows that the discrete fracture network simulation technique includes two processing methods. In one of the methods, the discrete fracture network geological model is first built according to the relevant parameters of individual discrete fracture of the intersecting fracture network, including fracture aperture, fracture extension direction, fracture length and so on; then the built discrete fracture network geological model provides input data for the dual porosity simulation model by relevant geological modeling software. The practical applications show that this processing method can not effectively characterize the rapid fluid channeling along large-aperture fractures. The reason is that a series of zigzag grids crossed by large-aperture fractures are used to describe the distribution of the fractures, although the hydraulic similarity of the fractures can be achieved by the equivalent treatment of the transmissibilities of large-aperture fractures, it is difficult to represent the actual geometric distribution characteristics of large aperture fractures (it is particularly true when the dimensions of the simulation grids are great). Thus this processing method can not meet the geometric similarity criterion.

The main idea of the other discrete fracture network simulation method is described as follows. Firstly, the flow equations of discrete fracture network system are given, which comprise the mass balance equations of all discrete fracture network nodes and all fracture segments, here a discrete fracture network node is a point where two or more fractures intersect or a fracture ends, and a fracture segment is the portion of a fracture which lies between two nodes. Secondly, the flow equations of matrix system must be given. Then the flow equations of discrete fracture network system are solved by analytic method based on Laplace transform. Lastly, on the basis of the computed fracture network variables, the matrix system flow equations are solved to obtain relevant variable values of the matrix system. This processing method can simultaneously meet the geometric similarity and hydraulic similarity simulation criteria. Theoretically, it can effectively represent the rapid fluid channeling along large-aperture fractures. However, the corresponding application examples of this processing method have not been reported in the literature. Furthermore, this processing method can not reflect the variation of fluid pressure and saturation along the same fracture segment, and the errors of the simulation results increase with the length of a fracture segment. Moreover, it is difficult to implement since the complicated Laplace transform and inverse Laplace transform are involved during the solving process.

Aiming at the solution to the above simulation problems, the present invention advances a new discrete fracture network processing method for numerical reservoir simulation, which is relatively simple in principle and easy to implement. Firstly, during the numerical simulation process of a reservoir with large-aperture fractures, each large-aperture fracture is treated with the "geometric similarity criterion", adopting the unstructured grid division to ensure that the so-called fracture grids, which are crossed by large-aperture fractures, can reflect the actual distribution characteristics of every large fracture (including the length, the extension direction and aperture), thus the geometric similarity of large-aperture fractures can be achieved. Secondly, the transmissibility of the grid face crossed by each large-aperture fracture must be equal to the actual transmissibility of corresponding large-aperture fracture, hence the hydraulic similarity of the large-aperture fracture can be obtained. Furthermore, the conventional dual porosity simulation software is improved to be an unstructured grid simulator. The application examples have demonstrated that the simulation method of the present invention can effectively characterize the rapid fluid channeling along large-aperture fractures.

SUMMARY OF THE PRESENT INVENTION

The object of the present invention is to provide a numerical simulation method for characterizing fluid channeling along large-aperture fractures of reservoirs, which is capable of simultaneously meeting the geometric similarity and hydraulic similarity simulation criteria.

The present invention comprises the following steps:

(1) Determine the region of interest for numerical reservoir simulation research and create the trace file (called "boundary trace file") of the simulation region boundary. The boundary trace file comprises the number of trace points, the serial number and X, Y coordinates of each trace point. The region of interest is an enclosed area formed by connecting each trace point in turn.

(2) Form the trace file of large-aperture fractures which influence the fluid flow, based on the geologic research. The trace file of large-aperture fractures consists of the total number of the large-aperture fractures, the serial number and aperture of each fracture, the corresponding trace point coordinates and the vertical range of simulation layers crossed by each large-aperture fracture. When the fracture trace is a curve, according to the differential principle, it can be divided into a series of line segments which is called fracture trace segments, in other words, the fracture trace curve is approximated by a series of line segments.

(3) Based on the trace data of the simulation region boundary obtained in step (1) and the trace information of each fracture trace segment obtained in step (2), make an unstructured grid division using a pre-processing software of numerical simulation. The divided grids are classified into two types: non-fracture grids and discrete fracture grids, here two sides of the horizontal projection for a discrete fracture grid have to be parallel to the corresponding fracture trace segment. Furthermore, the width and length of a discrete fracture grid could be designated artificially, and could be allowed to be different from each other for different grids. In general, the width of a discrete fracture grid is controlled in the range of 1 m to 2 m. If the width of a discrete fracture grid is too small, the numerical solutions will probably not be converged. If the width of a discrete fracture grid is too large, the geometric similarity criterion will not be met, therefore the rapid fluid channeling along large-aperture fractures can not be effectively characterized. The length of a discrete fracture grid is controlled within a range from 10 m to 50 m. If the length of a discrete fracture grid is too small, the convergence of numerical solutions will be influenced; if the length of a discrete fracture grid is too large, it is difficult to represent the variation features of pressure and fluid saturation in the fractures.

(4) Based on the grids obtained in step (3) and the geologic research, build the static model for the numerical reservoir simulation by an interpolation method. The static model consists of the specification of geometry of computational grid (location of grid block corners), and of rock properties (effective thickness, porosity, absolute permeability) in each grid block.

(5) Make the hydraulic similarity treatment of large-aperture fractures, namely, adjust the static model obtained in step (4), and modify the permeability of the grid face crossed by a fracture for each discrete fracture grid, with a formula as below:

permeability=(fracture aperture)$^2$/12, here the unit of the fracture aperture is jam, and the unit of the permeability is Darcy($\mu m^2$).

(6) Based on the adjusted static model in step (5), create the reservoir simulation model by the conventional modeling method. The reservoir simulation model comprises the grid geometry data (location of grid block corners), the reservoir rock properties, fluid physical parameters, relative permeability and capillary pressure data, positions of injection and production wells, dynamic data, process parameters and the convergence control parameters needed by solving iteratively.

(7) Improve the traditional dual porosity numerical simulation software to be capable of accepting the unstructured grids formed in step (3). Run the reservoir simulation model obtained in step (6) with the above unstructured grid simulator. As a result, the features of rapid fluid channeling along large-aperture fractures can be simulated effectively.

The advantages of the present invention are shown as below. The method of the present invention can simultaneously meet the geometric similarity and hydraulic similarity criteria, and effectively simulate the rapid fluid channeling along large-aperture fractures. Consequently it can ensure the reliability of the simulation results and provide reasonable references to the adjustment and optimization of oil field development plans.

DETAILED DESCRIPTION OF THE PREFERRED EMBODIMENT

Figure 1:
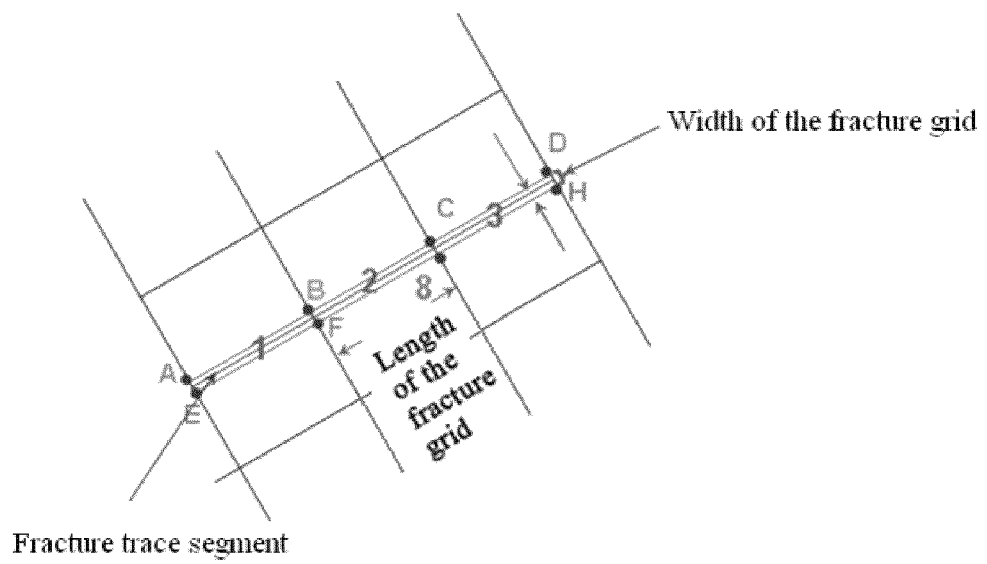
FIG. 1 is a schematic view of the width and length of the discrete fracture grid.

The present invention is further explained in detail with the accompanying drawings. It comprises the steps as below.

(1) Determine the region of interest for numerical reservoir simulation research and create the trace file (called "boundary trace file") of the simulation region boundary. The boundary trace file comprises the number of trace points, the serial number and X, Y coordinates of each trace point. The region of interest is an enclosed area formed by connecting each trace point in turn.

(2) Form the trace file of large-aperture fractures which influence the fluid flow, based on the geologic research. The trace file of large-aperture fractures consists of the total number of the large-aperture fractures, the serial number and aperture of each fracture, the corresponding trace point coordinates and the vertical range of simulation layers crossed by each large-aperture fracture. When the fracture trace is a curve, according to the differential principle, it can be divided into a series of line segments which is called fracture trace segments, in other words, the fracture trace curve is approximated by a series of line segments.

```
NUMFRAC 2
FRACTURE 1
APERTURE 300
ZSCOPE   1   3
START 117.355   47.24   0
END   148.245  225.83   0
-9999.9999
FRACTURE 2
APERTURE 300
ZSCOPE   2   3
```

-continued

```
START 237.38   46.055  0
END    103.675 86.51   0
       -9999.9999
```

The above 13 rows of data form a trace file of two fractures, where NUMFRAC in the first row is the key word of the number of fractures, the following quantity 2 is the number of the large fractures; FRACTURE in the second row is the key word of the serial number of a fracture, the following quantity 1 is the numbering of the fracture; APERTURE in the third row is the key word of the fracture aperture, the following quantity 300 shows that the fracture aperture is 300 μm; ZSCOPE in the fourth row is the key word of the range of the simulation layers, the following first quantity 1 shows that the numbering of the uppermost simulation layer crossed by the fracture is 1, the following second quantity 3 shows that the numbering of the lowermost simulation layer crossed by the fracture is 3; START in the fifth row is the key word of coordinates of the starting point of the fracture trace segment, the following three quantities are X, Y and Z coordinates of the starting point; END in the sixth row is the key word of coordinates of the end point of the fracture trace segment, the following three quantities are X, Y and Z coordinates of the end point; -9999.9999 is an end mark of the input for the trace information of a fracture;

(3) Based on the trace data of the simulation region boundary obtained in step (1) and the trace information of each fracture trace segment obtained in step (2), make an unstructured grid division using a pre-processing software of numerical simulation. The divided grids are classified into two types: non-fracture grids and discrete fracture grids, here two sides of the horizontal projection for a discrete fracture grid have to be parallel to the corresponding fracture trace segment. Furthermore, the width and length of a discrete fracture grid could be designated artificially, and could be allowed to be different from each other for different grids. In general, the width of a discrete fracture grid is controlled in the range of 1 m to 2 m. If the width of a discrete fracture grid is too small, the numerical solutions will probably not be converged. If the width of a discrete fracture grid is too large, the geometric similarity criterion will not be met, therefore the rapid fluid channeling along large-aperture fractures can not be effectively characterized. The length of a discrete fracture grid is controlled within a range from 10 m to 50 m. If the length of a discrete fracture grid is too small, the convergence of numerical solutions will be influenced; if the length of a discrete fracture grid is too large, it is difficult to represent the variation features of pressure and fluid saturation in the fractures.

(4) Based on the grids obtained in step (3) and the geologic research, build the static model for the numerical reservoir simulation by an interpolation method. The static model consists of the specification of geometry of computational grid (location of grid block corners), and of rock properties (effective thickness, porosity, absolute permeability) in each grid block.

(5) Make the hydraulic similarity treatment of the large-aperture fractures, namely, adjust the static model obtained in step (4), and modify the permeability of the grid face crossed by a fracture for each discrete fracture grid, with a formula as below:

$$\text{permeability} = (\text{fracture aperture})^2/12, \text{ here the unit of the fracture aperture is jam, and the unit of the permeability is Darcy}(\mu m^2).$$

(6) Based on the adjusted static model in step (5), create the reservoir simulation model by the conventional modeling method. The reservoir simulation model comprises the grid geometry data (location of grid block corners), the reservoir rock properties, fluid physical parameters, relative permeability and capillary pressure data, positions of injection and production wells, dynamic data, process parameters and the convergence control parameters needed by solving iteratively.

(7) Improve the traditional dual porosity numerical simulation software to be capable of accepting the unstructured grids formed in step (3).

To realize the unstructured grid simulation, one key point is to find the adjacent grids of a grid. In the traditional rectangular grid simulation, the adjacent grids of a grid are searched only in the X, Y and Z directions; then, the fluid exchange volumes between the grid and its each adjacent grid are calculated based on the relevant data of these two grids. However, in the reservoir simulation of unstructured grid, the number of the surfaces of each grid is calculated according to its vertex coordinates, then the adjacent grids are found by comparing the vertex coordinates of all the grids. If a surface of grid I coincides with a surface of grid J (namely, the vertexes of the two surfaces are identical), the grid J will be the adjacent grid of the grid I.

The calculation of directional permeabilities is also required in the unstructured grid simulation. Geological modeling can only provide the permeabilities of each grid in the directions of three coordinate axes. However, in the unstructured grid numerical simulation, the connecting line between the center points of two adjacent grids is not inevitably parallel to one of the three coordinate axes; thus, the permeability between two grids can not directly use the input value in the geological model. Here, the method given by Gfwenkorn and Johnson is used to determine the permeability in the direction of the connecting line between the center points of two adjacent grids (A. GFWENKORN, C. R. JOHNSON, "Directional Permeability of Heterogeneous Anisotropic Porous Media", SPE-788, 1963).

After determining the directional permeability between two adjacent unstructured grids, in the process of spacial flow items, the fluid exchange volume between the two grids is calculated by the same method as that of rectangular grid numerical simulation.

Another difference between the unstructured grid simulation and the rectangular grid simulation is the input mode of perforation information of wells. In the rectangular grid simulation, the perforated grids of a well are generally designated by the grid numbering (I, J, K) in the directions of three coordinate axes, here I, J, K denotes the grid numbering in the X, Y, Z directions, respectively. However, in the unstructured grid simulation, the perforated grids of a well are designated by the planar grid numbering IXY and vertical grid numbering K.

(8) Run the reservoir simulation model obtained in step (6) with the unstructured grid simulator obtained in step (7), as a result, the rapid fluid channeling along large-aperture fractures can be characterized effectively.

EXAMPLES

Figure 2:
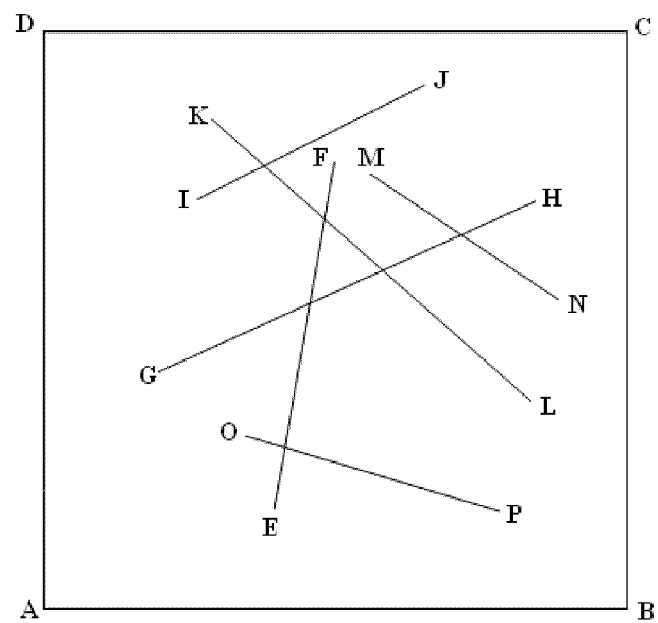
FIG. 2 is a distribution view of six fractures with large-aperture and the boundary trajectories of a simulation region.

FIG. 2 shows the distribution of six intersecting fractures with large-aperture and a simulation region of a reservoir. The boundary trace of the simulation region is made up of the line segments AB, BC, CD and DA. The coordinates of A, B, C and D are A(0, 0), B(300, 0), C(300, 300) and D(0, 300), respectively. The traces of six large-aperture fractures are the line segments EF, GH, IJ, KL, MN and OP. The coordinates of the trace points are E(117.355, 47.240), F(148.245, 225.830), G(55.245, 116.680), H(254.790, 207.970), I(76.425, 207.895), J(196.170, 267.565), K(86.760, 249.650), L(252.980, 101.395), M(166.765, 221.815), N(255.505, 156.285), O(103.675, 86.510), P(237.380, 92.110), respectively.

Figure 3:
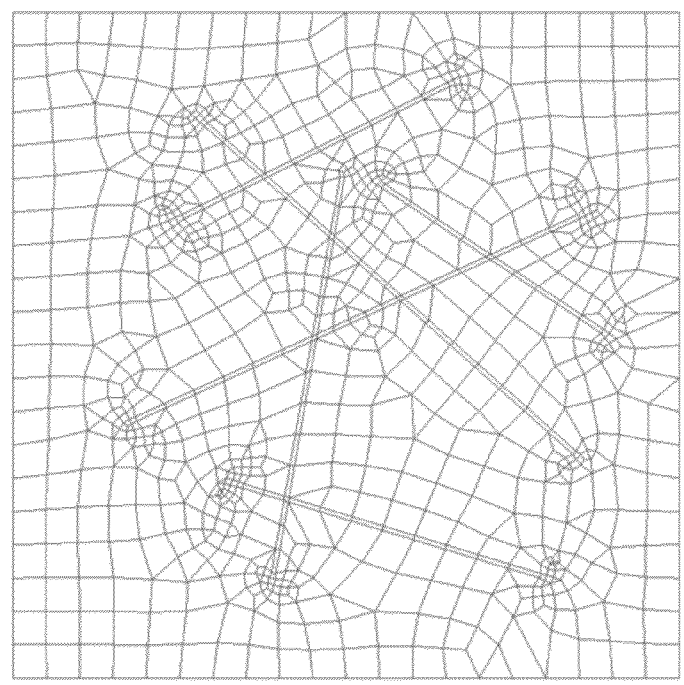
FIG. 3 is a top view of the grid division.

Based on the trace data of the above simulation region boundary and large-aperture fractures, grid division is made by the special grid division software. Here the grids are vertically divided into three layers. The grid thickness of each layer is 5 m. The top view of the divided grids is shown in FIG. 3.

In the static geological model, the reservoir permeability is 3.2 mD, the porosity is 0.13, the total thickness of the reservoir is 15 m, the initial oil saturation is 0.79, the initial water saturation is 0.21, and the formation pressure is 31.47 MPa.

During the hydraulic similarity treatments of the large-aperture fractures (namely, modify the permeabilities of the grid faces crossed by the large-aperture fractures), the apertures of the fractures EF, GH, IJ, KL, MN, OP are 200 μm, 210 μm, 230 μm, 290 μm, 300 μm, and 310 μm, respectively; so the permeabilities of the grid faces crossed by the fractures EF, GH, IJ, KL, MN and OP are 3333.333D, 3675.000D, 4408.333D, 7008.333D, 7500.000D, and 8008.333D, respectively.

Figure 4:
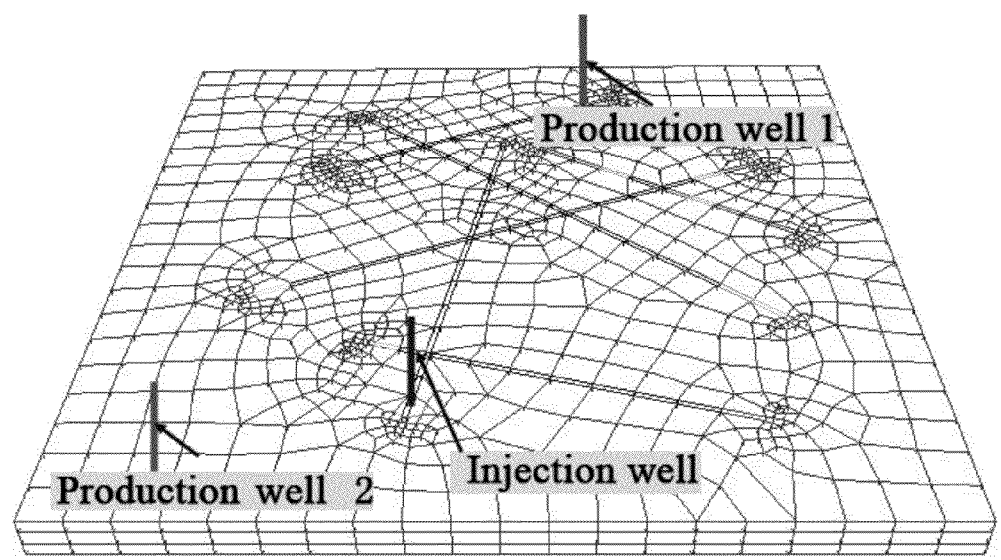
FIG. 4 shows the positions of injection and production wells.

FIG. 4 shows the positions of an injection well and two production wells. The injection rate of the injection well is 29 m³/day, and the upper limit of the BHP (bottom hole pressure) for the injection well is 56 MPa. The liquid rate of the production well 1 is 21 m³/day, and 8 m³/day for production well 2. The lower limits of the BHP are 18 MPa and water cut upper limits are 0.98 for both the production wells. The maximum number of Newton iterations in a timestep is 18, and the maximum number of linear iterations in a Newton iteration is 81, the maximum linear convergence error is 1E-8, and all the other control parameters use the default values.

Figure 5:
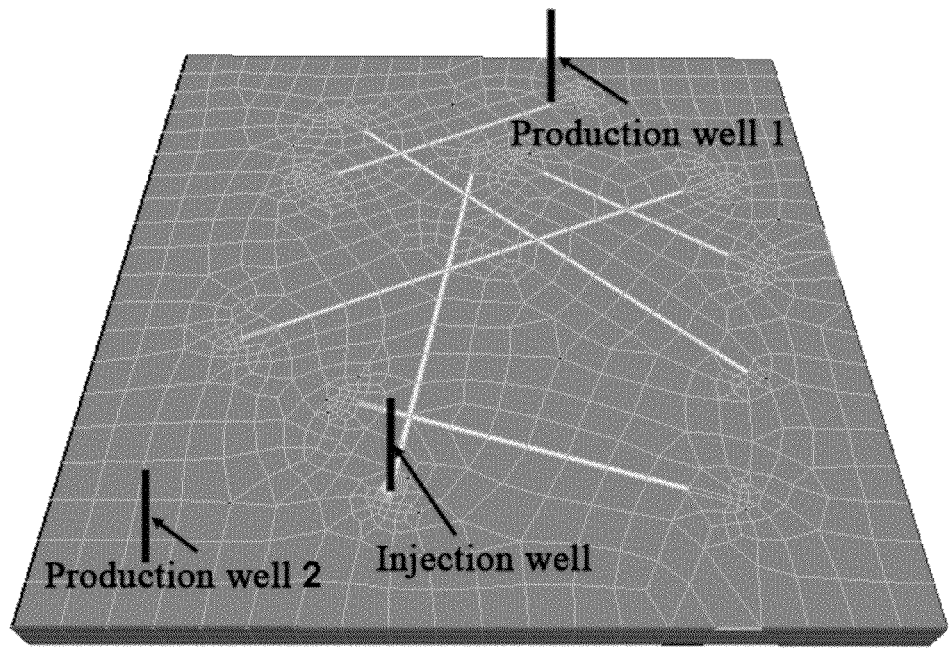
FIG. 5 shows the fluid saturation field when water breakthrough of the production well 1 occurs, in the case of the geometric similarity and hydraulic similarity of the large-aperture fractures being met simultaneously.

Run the above model using the unstructured grid simulator obtained in the present invention. The results show that the injected water flows quickly along the large-aperture fractures. For the production well 1 which is far away from the injection well (233.9977 m) but communicates with the injection well by large-aperture fractures, the water breakthrough occurs soon after producing for 21 days (the water saturation field at water breakthrough is shown in FIG. 5, the lighter the color is, the greater the water saturation is; the heavier the color is, the smaller the water saturation is). The calculated average velocity of injected water in the large-aperture fractures is up to 13.698 m/day (the total length of the large-aperture fractures which lies between the injection well and the production well 1 is 287.667 m). The production well 1 will hardly produce oil after 150 days (water cut is 95.187%). However, for the production well 2 which is close to the injection well (72.3897 m), the water breakthrough occurs much later, because the calculated water breakthrough time is 1800 days. The late water breakthrough of the production well 2 is because the reservoir is a low permeability reservoir (only 3.2 mD), and the production well 2 is not fractured and produces by low liquid rate (only 8 m³/day), in addition, most of the injected water is produced by the production well 1 due to the fluid channeling along large-aperture fractures.

Figure 6:
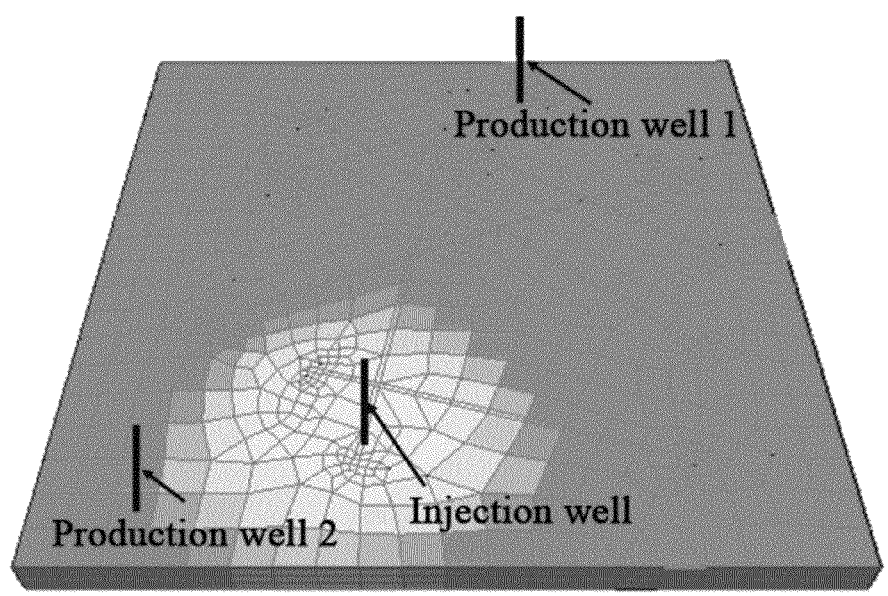
FIG. 6 shows the saturation field when the water breakthrough of the production well 2 occurs, in the case of only the geometric similarity of the large-aperture fracture being satisfied.

If the large-aperture fractures are treated only with the geometric similarity, and not with the hydraulic similarity, namely, only the distribution characteristics of large-aperture fractures are reflected by the unstructured grid division, while the permeabilities of the grid faces crossed by large-aperture fractures are not adjusted, all the other model parameters are the same as those of the above example. The simulation results show that the water breakthrough of the production well 2 occurs after producing for 430 days (the water saturation field at water breakthrough is shown in FIG. 6, the lighter the color is, the greater the water saturation is; and the heavier the color is, the smaller the water saturation is). When water breakthrough occurs for the production well 1 after producing 2111 days, the production well 2 almost only produces water (the water cut is 94.91%). Obviously this simulation method with only the geometric similarity treatments of the large-aperture fractures can not characterize the rapid fluid channeling along large-aperture fractures.

Figure 7:
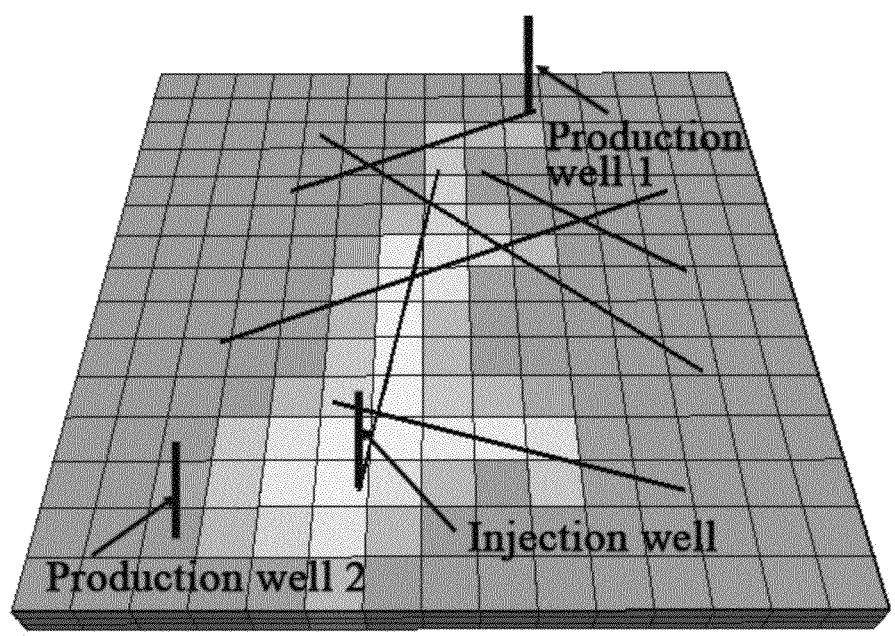
FIG. 7 shows the saturation field when water breakthrough of the production well 1 occurs, in the case of only the hydraulic similarity of the large-aperture fractures being met.

If the large-aperture fractures are treated only by the hydraulic similarity, and not by the geometric similarity, namely, a series of zigzag grids crossed by the large-aperture fractures are used to represent the distribution of these fractures, while the unstructured grid division which could reflect distribution features of the large-aperture fractures is not made; based on the discrete aperture fracture network geological modeling, the equivalent treatments of transmissibilities are made for the grid faces intersected by the large-aperture fractures, and all the other model parameters are the same as those of the first example. The simulation results show that the water breakthrough of the production well 1 occurs after producing for 430 days (the water saturation field at water breakthrough is shown in FIG. 7, the lighter the color is, the greater the water saturation is; and the heavier the color is, the smaller the water saturation is). The water breakthrough time of the production well 2 is 540 days, and the calculated average velocity of injected water in the large-aperture fractures is only 0.533 m/day. It is obvious that this simulation method with only the hydraulic similarity treatments of the large-aperture fractures also can not characterize the rapid fluid channeling along large-aperture fractures.

The above three examples show that only in the case of simultaneously making the geometric similarity and hydraulic similarity treatments of the large-aperture fractures, the simulation results can effectively reflect the fluid channeling along large-aperture fractures.

What is claimed is:

1. A numerical simulation method for characterizing fluid channelling along fractures of reservoirs, comprising the steps of:
   (1) determining a region of interest for numerical reservoir simulation research and creating a boundary trace file of a simulation region boundary, wherein the boundary trace file comprises an amount of trace points, a serial number and X, Y coordinates of each trace point, the region of interest is an enclosed area formed by connecting each trace point in turn;
   (2) forming a trace file of fractures which influence a fluid flow, based on a geologic research, wherein the trace file of fractures consists of a total amount of the fractures, a serial number and aperture of each fracture, corresponding trace point coordinates and vertical ranges of simulation layers crossed by each fracture;
   (3) based on trace data of the simulation region boundary obtained in step (1) and trace information of each fracture trace segment obtained in step (2), making an unstructured grid division using a pre-processing software of numerical simulation, wherein divided grids are classified into two types: non-fracture grids and discrete fracture grids, and two sides of a horizontal projection for a discrete fracture grid is parallel to a corresponding fracture trace segment;
   (4) based on the grids obtained in step (3) and the geologic research, building a static model for the numerical reservoir simulation by an interpolation method, wherein the static model consists of a specification of geometry of computational grid (location of grid block corners), and of rock properties (effective thickness, porosity, absolute permeability) in each grid block;

(5) adjusting the static model obtained in step (4), and modifying a permeability of a grid face crossed by a fracture for each discrete fracture grid, with a formula of:

permeability=(fracture aperture)$^2$/12, here an unit of the fracture aperture is µm, and an unit of the permeability is Darcy(µm$^2$);

(6) based on the adjusted static model in step (5), creating a reservoir simulation model, wherein the reservoir simulation model comprises grid geometry data (location of grid block corners), reservoir rock properties, fluid physical parameters, relative permeability and capillary pressure data, positions of injection and production wells, dynamic data, process parameters and convergence control parameters needed by solving iteratively;

(7) improving a dual porosity numerical simulation software to be capable of accepting unstructured grids formed in step (3); and (8) running the reservoir simulation model obtained in step (6) with a unstructured grid simulator obtained in step (7), as a result, a fluid channelling along fractures can be characterized effectively.

2. The numerical simulation method, as recited in claim 1, wherein step (7) comprises (7A) finding an adjacent grid of a grid; (7B) determining a permeability in a direction of a connecting line between center points of two adjacent grids; (7C) after determining a directional permeability, making a spacial flow process; and (7D) determining an input mode of perforation information of wells.

3. The numerical simulation method, as recited in claim 2, wherein in step (7A), firstly, calculate an amount of surfaces of each grid according to vertex coordinates, and then find the adjacent grids by comparing vertex coordinates of all the grids.

4. The numerical simulation method, as recited in claim 2, wherein in step (7D), perforated grids of a well are designated by a planar grid numbering IXY and a vertical grid numbering K, here, IXY denotes an in-plane grid numbering, and K denotes a grid numbering in Z direction.

5. The numerical simulation method, as recited in claim 3, wherein in step (7D), perforated grids of a well are designated by a planar grid numbering IXY and a vertical grid numbering K, here, IXY denotes an in-plane grid numbering, and K denotes a grid numbering in Z direction.

6. The numerical simulation method, as recited in claim 1, wherein in step (2), when the fracture trace is a curve, according to a differential principle, use a series of fracture trace segments to approximate the fracture trace.

7. The numerical simulation method, as recited in claim 2, wherein in step (2), when the fracture trace is a curve, according to a differential principle, use a series of fracture trace segments to approximate the fracture trace.

8. The numerical simulation method, as recited in claim 3, wherein in step (2), when the fracture trace is a curve, according to a differential principle, use a series of fracture trace segments to approximate the fracture trace.

9. The numerical simulation method, as recited in claim 4, wherein in step (2), when the fracture trace is a curve, according to a differential principle, use a series of fracture trace segments to approximate the fracture trace.

10. The numerical simulation method, as recited in claim 5, wherein in step (2), when the fracture trace is a curve, according to a differential principle, use a series of fracture trace segments to approximate the fracture trace.

11. The numerical simulation method, as recited in claim 1, wherein in step (3), a width of a discrete fracture grid is controlled within a range from 1 m to 2 m, and a length of a discrete fracture grid is controlled within a range from 10 m to 50 m.

12. The numerical simulation method, as recited in claim 2, wherein in step (3), a width of a discrete fracture grid is controlled within a range from 1 m to 2 m, and a length of a discrete fracture grid is controlled within a range from 10 m to 50 m.

13. The numerical simulation method, as recited in claim 3, wherein in step (3), a width of a discrete fracture grid is controlled within a range from 1 m to 2 m, and a length of a discrete fracture grid is controlled within a range from 10 m to 50 m.

14. The numerical simulation method, as recited in claim 4, wherein in step (3), a width of a discrete fracture grid is controlled within a range from 1 m to 2 m, and a length of a discrete fracture grid is controlled within a range from 10 m to 50 m.

15. The numerical simulation method, as recited in claim 5, wherein in step (3), a width of a discrete fracture grid is controlled within a range from 1 m to 2 m, and a length of a discrete fracture grid is controlled within a range from 10 m to 50 m.

16. The numerical simulation method, as recited in claim 6, wherein in step (3), a width of a discrete fracture grid is controlled within a range from 1 m to 2 m, and a length of a discrete fracture grid is controlled within a range from 10 m to 50 m.

17. The numerical simulation method, as recited in claim 7, wherein in step (3), a width of a discrete fracture grid is controlled within a range from 1 m to 2 m, and a length of a discrete fracture grid is controlled within a range from 10 m to 50 m.

18. The numerical simulation method, as recited in claim 8, wherein in step (3), a width of a discrete fracture grid is controlled within a range from 1 m to 2 m, and a length of a discrete fracture grid is controlled within a range from 10 m to 50 m.

19. The numerical simulation method, as recited in claim 9, wherein in step (3), a width of a discrete fracture grid is controlled within a range from 1 m to 2 m, and a length of a discrete fracture grid is controlled within a range from 10 m to 50 m.

20. The numerical simulation method, as recited in claim 10, wherein in step (3), a width of a discrete fracture grid is controlled within a range from 1 m to 2 m, and a length of a discrete fracture grid is controlled within a range from 10 m to 50 m.

* * * * *